May 30, 1950 H. G. EARP 2,509,337

PUSH-PULL DIODE DETECTOR

Filed Dec. 22, 1947

Inventor

Howard G. Earp

Patented May 30, 1950

2,509,337

UNITED STATES PATENT OFFICE 2,509,337

PUSH-PULL DIODE DETECTOR

Howard G. Earp, Silver Spring, Md.

Application December 22, 1947, Serial No. 793,114

5 Claims. (Cl. 250—27)

My invention is related to improvements in the diode type detector, particularly by circuits which provide push pull audio output components, and by circuits which combine this feature with voltage multiplication.

One object of this invention is to improve present types of diode detectors in order to provide for two 180 degrees out of phase audio components in the diode load resistance, which may be used for push pull excitation, thereby eliminating a subsequent phase-inverting device.

Another object of this invention is to improve the tonal quality of a radio receiver by obtaining the well known advantages inherent with a balanced push pull output.

Another object is to obtain, together with the push pull output, a voltage multiplication in the detector stage.

Another object is to improve detector circuits by utilizing the entire modulation envelope for detection; in accomplishing this to divide the detector circuit into two halves, one half detecting the positive sideband of the modulated radio frequency (hereinafter referred to as RF) carrier, and the other half detecting the negative sideband; the audio output from the first half being 180 degrees out of phase with the output from the second half, or in push pull relationship.

Another object of this invention is to provide a detector circuit which has two halves, both of which detect the same sideband of the RF carrier, but which by reversely connecting the diodes in one half, provides two audio components which are in push pull relationship.

The basic invention consists in grounding the midpoint of the total load resistance in the detector stage, connecting two diode rectifiers in such a manner that the ends of said load resistance have an opposite D. C. polarity to ground, (due to the rectified RF current flow), and taking push pull audio outputs from opposite sides of the load resistance. This may be accomplished by tuned or untuned diode detector circuits, and by half or full wave demodulation.

Figure 2:
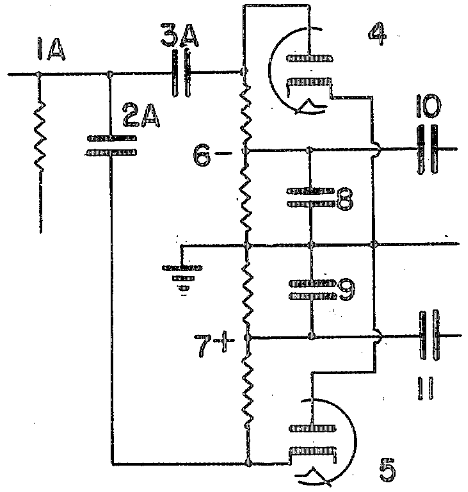
Figure 1:
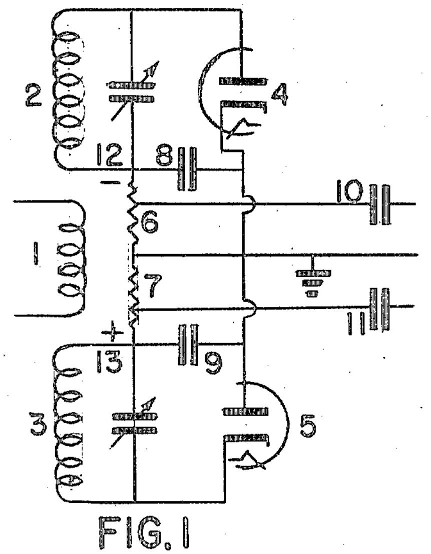

For a complete understanding of my invention reference is made to the appended drawings, together with the following detailed description covering the novel features essential to it. The invention has been illustrated by the following circuits, in which conventional diode detector circuits have been modified and improved in accordance with the principles outlined above:

Fig. 1, Fig. 2, double diode detectors with twice the voltage output of conventional diode detectors.

Fig. 2 a double diode detector, untuned type.

Figure 3:
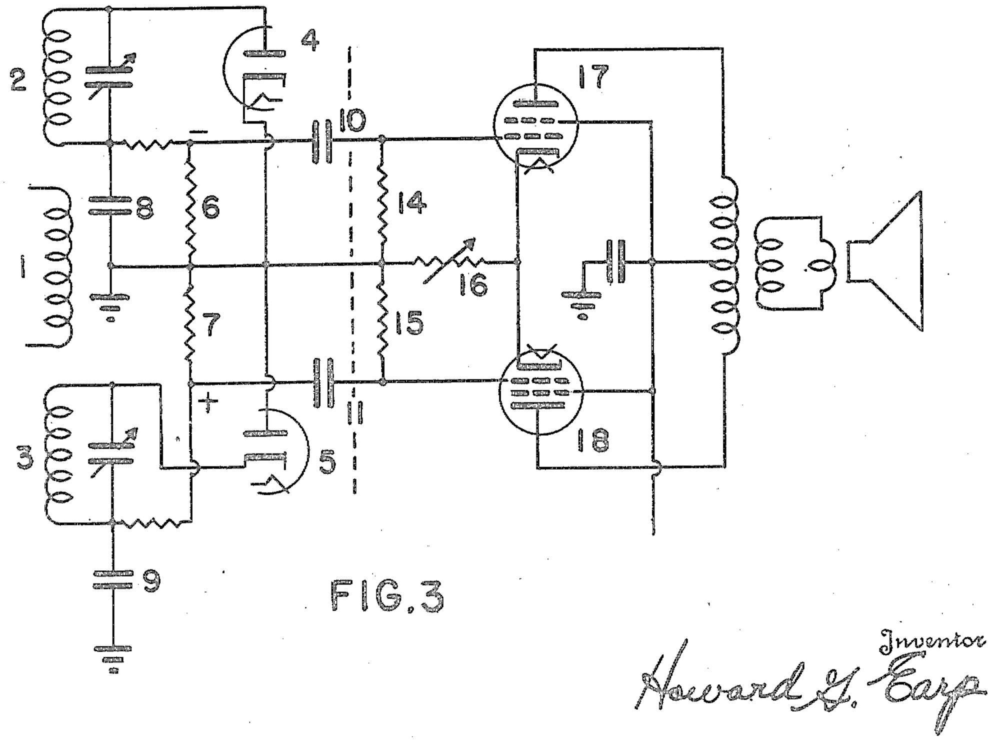

Fig. 3 is an example of the push pull detector connected to the audio portion of a radio receiver.

Referring to Fig. 1, primary winding 1 of a radio frequency transformer is coupled equally to secondaries 2 and 3, all of which are tuned to the same frequency. Secondary 2 is connected between the anode of diode 4 and load resistance 6. The other end of resistance 6 is grounded, as is the cathode of diode 4. Condensers 8 and 9 are bypass condensers for radio frequency filtering, at each end of the load resistance 6, 7. Secondary 3 is connected between the cathode of diode 5 and resistor 7 which is in series to ground. The anode of diode 5 is grounded. The push pull audio outputs are taken from points equidistant from ground along resistors 6 and 7, and are coupled through condensers 10 and 11 to the excited circuits.

Operation of diode 4 and its associated circuit above the ground line is strictly conventional. Operation of the diode 5 and its associated circuit below the ground line is similar, with the exception that the current flow through resistor 7 is opposite in polarity to ground to that through resistor 6 Opposite ends of the total load resistance have opposite D. C. polarity to ground. During the amplitude modulation cycles equidistant points from ground along resistors 6 and 7 will provide push pull audio outputs, which are indicated as coupled by condensers 10 and 11 to the excited circuits. Point 12 will have, in the presence of a rectified carrier, a negative D. C. voltage proportional to the carrier level. Point 13 will be, at the same time, an equal positive D. C. voltage from ground.

If secondaries 2 and 3 have the same polarity in respect to the primary 1 as in Fig. 2, diodes 4 and 5 will conduct simultaneously during the positive half cycles of the alternating radio frequency voltages which comprise the modulation envelope. However, if one of the secondaries is reversely connected, (as illustrated by secondary 3 in Fig. 3), the diodes will conduct on alternate half cycles; diode 4 will then rectify the positive side band of the modulated carrier, and diode 5 the negative side band. Practically this will make no difference in the phase of the two outputs, and the full wave rectification thus obtained will provide a more balanced loading of the primary 1 and higher fidelity.

Fig. 2 is a full wave, untuned detector. Typical values are as follows for Fig. 2: Condensers 2A and 3A, .0001 mfd. each; condensers 10 and 11, .0002 mfd. each; condensers 12 and 13, .005 mfd.

each; resistors 6 and 9, 100,000 ohms each; diodes 4 and 5, crystal diodes or diodes in vacuum tubes.

Fig. 3 is a diagram of the push pull detector (recognized as similar to Fig. 1 with the transformer secondaries reversely connected), connected to a push pull output amplifier stage in a radio receiver.

In all the above circuits there are many slight variations in design possible by anyone skilled in the art, which do not essentially change the operation. For instance, the radio frequency filter may comprise two condensers in each diode circuit instead of one, there may be a filter resistor between them in series with the load resistance. Or the midpoint of the load resistance may be the arm of a potentiometer. Coupling between the secondaries and the primary of the transformers may be varied for balance in the output. Potentiometers may be substituted for fixed resistors. Voltage multiplication may be carried out to tripling, etc., by using more diode and tuned circuit elements. Automatic volume control may be obtained from the end of the load resistance which provides the proper negative D. C. voltage, or preferably from a separate diode which obtains its voltage from the primary of the RF transformer, in order to avoid unbalance of the output. Therefore, my invention should not be limited to the exact circuits diagrammed, but should be limited only essentially by the scope of the appended claims.

I claim:

1. A push pull demodulator circuit in a radio receiver comprising two diode rectifiers, two secondaries of a RF transformer, and two load resistors, all of which are series connected; the transformer secondaries connected between dissimilar electrodes of the two diodes and the two load resistors, the remaining electrodes of the two diodes connected to ground, the opposite ends of the load resistance filtered for RF, and the midpoint of the total load resistance connected to ground.

2. A push pull detector circuit in a radio receiver comprising dissimilar electrodes of two diode rectifiers connected by separate condensers to a RF source, said electrodes each connected by separate load resistances to the junction of the remaining electrodes, said junction grounded, and said load resistances being filtered for RF.

3. A push pull detector circuit for a radio receiver comprising a RF transformer having a plurality of secondaries, each secondary being connected in series with a load resistance, which is bypassed for RF filtering, and a diode rectifier; said secondary circuits being series connected for voltage multiplication, said diode rectifiers where series connected being connected by dissimilar electrodes, the midpoint of the total load resistance connected to ground.

4. A demodulator circuit in a radio receiver comprising two diode rectifiers coupled by separate means to a RF source, each rectifier in series with a separate load resistance which is filtered for RF at one end, grounded at the other end; one diode being reversely connected, ungrounded ends of the load resistances having opposite D. C. polarity to ground; and a capacitative output connection from each load resistance to provide a balanced push pull output.

5. A push pull AM demodulator circuit in a radio receiver comprising two diode rectifiers, each of which is in series with a separate secondary of a RF transformer (primary and secondaries tuned to the same frequency), and a load resistor; one end of each load resistor filtered for RF, the other end grounded; the unfiltered ends of each transformer secondary connected to dissimilar electrodes of the rectifiers, the polarity of the transformer secondaries connected reversely for full wave detection, a capacitative output connection from each load resistor to provide for a balanced push pull output.

HOWARD G. EARP.

REFERENCES CITED

The following references are of record in the file of this patent:

UNITED STATES PATENTS

| Number | Name | Date |
|---|---|---|
| 1,919,160 | Farnham | July 18, 1933 |
| 2,085,408 | Barton | June 29, 1937 |
| 2,222,759 | Burnside | Nov. 26, 1940 |

OTHER REFERENCES

"Detection at Large Inputs" by W. F. Cope, Wireless Engineer for August 1935; pages 437, 438.